United States Patent [19]

Harvey et al.

[11] Patent Number: 6,042,474
[45] Date of Patent: Mar. 28, 2000

[54] COMPACT VENTILATION UNIT WITH EXHAUST PORTS FOR ELECTRONIC APPARATUS

[75] Inventors: Robert T. Harvey; Tina M. Reintjes, both of Wichita, Kans.

[73] Assignee: LSI Logic Corporation, Milpitas, Calif.

[21] Appl. No.: 08/869,267

[22] Filed: Jun. 4, 1997

[51] Int. Cl.[7] .................................................. H05K 5/00
[52] U.S. Cl. ...................................... 454/184; 415/182.1
[58] Field of Search .................................. 454/184, 187; 415/182.1; 361/695

[56] References Cited

U.S. PATENT DOCUMENTS

| | | | |
|---|---|---|---|
| 4,502,100 | 2/1985 | Greenspan et al. | 361/384 |
| 4,751,872 | 6/1988 | Lawson, Jr. | 98/1 |
| 4,756,473 | 7/1988 | Takemae et al. | 236/49 |
| 4,767,262 | 8/1988 | Simon | 415/119 |
| 4,899,254 | 2/1990 | Ferchau et al. | 361/384 |
| 5,163,870 | 11/1992 | Cooper | 454/184 |
| 5,193,050 | 3/1993 | Dimmick et al. | 361/384 |
| 5,247,427 | 9/1993 | Driscoll et al. | 361/685 |
| 5,285,347 | 2/1994 | Fox et al. | 361/385 |
| 5,339,214 | 8/1994 | Nelson | 361/695 |
| 5,398,159 | 3/1995 | Andeson et al. | 361/695 |
| 5,409,419 | 4/1995 | Euchner et al. | 454/184 |
| 5,438,226 | 8/1995 | Kuchta | 307/125 |
| 5,484,012 | 1/1996 | Hiratsuka | 165/40 |
| 5,490,723 | 2/1996 | Driscoll et al. | 312/334.28 |
| 5,493,474 | 2/1996 | Schkrohowsky et al. | 361/695 |
| 5,505,533 | 4/1996 | Kamersqard et al. | 312/236 |
| 5,540,548 | 7/1996 | Eberhardt et al. | 415/182.1 |
| 5,562,410 | 10/1996 | Sachs et al. | 415/213.1 |
| 5,572,403 | 11/1996 | Mills | 361/695 |

FOREIGN PATENT DOCUMENTS

| | | | |
|---|---|---|---|
| 0427656 | 10/1990 | European Pat. Off. | G06F 1/20 |
| 2416103 | 10/1975 | Germany | 361/695 |
| 385797 | 4/1991 | Japan | 361/695 |
| 1101588 | 7/1984 | Russian Federation | 415/60 |
| 413351 | 8/1910 | United Kingdom | 415/60 |

*Primary Examiner*—Harold Joyce
*Assistant Examiner*—Derek Boles
*Attorney, Agent, or Firm*—Wayne P. Bailey; Jean Macheledt

[57] ABSTRACT

A ventilation unit for operative arrangement within an electronic apparatus. This unit has: an exterior side having a first exhaust port separated from, and located in stacked relationship with, a second exhaust port; and a first and second powered air mover, each having an intake side oriented at an angle greater than zero degrees from the exterior side. The first powered air mover intake side is in communication with the first exhaust port. One powered air mover can be located closer to the exterior side than the other. Gas, such as air, removed from the electronic apparatus can be drawn in through an intake side of the second powered air mover, then directed through a duct cover before it flows between a covered side of the first powered air mover and a support member side of the unit. The angle of orientation is preferably between twenty and one-hundred degrees. Additional powered air movers can be accommodated, each with a respective exhaust port. Also, a ventilation unit with an exterior side having first and second exhaust ports; the exterior side being adjacent a support member side to which a second powered air mover has been secured. A first powered air mover is included in communication with the first exhaust port. The first powered air mover can have a first covered side opposite an intake side. Gas drawn in through an intake side of the second powered air mover flows between the first covered side and the support member side before exiting the second exhaust port. Additionally, a method of venting thermal energy generated within an electronic apparatus through an exterior side of a ventilation unit operating within the apparatus. This method comprises the steps of drawing air in through a first intake side of a first powered air mover and out a first exhaust port of the exterior side, separately from drawing air in through a second intake side of a second powered air mover and out a second exhaust port of the exterior side located in stacked relationship with the first exhaust port.

23 Claims, 5 Drawing Sheets

COMPACT VENTILATION UNIT WITH EXHAUST PORTS FOR ELECTRONIC APPARATUS

BACKGROUND OF THE INVENTION

In general, the present invention relates to cooling systems for electronic circuitry, and more particularly, to a new compact ventilation unit for operative arrangement within a computerized apparatus having at least two powered air movers, located in stacked relationship to one another, each air mover having its own exhaust port.

It is well known that electronic equipment, and specifically computerized devices, generate thermal energy when powered-up and operating. To prevent component failure and early degradation due to overheating, heat must be vented from within computerized devices. As the overall size of computerized devices continues to decrease with new models, the speed and the size of memory and fixed storage of these devices has dramatically increased. These newer models often have many more electronic components and printed circuit boards (upon which components are mounted), compacted into a smaller chassis. Regulating the temperature of many electronic components within a smaller chassis has become a challenge. There is simply too little space available in newer model computerized devices to accommodate known ventilation systems. Particularly, a smaller chassis has less available "real estate" on its external back panel where connectors, peripheral connection ports, ventilation exhaust ports, and fasteners compete for space.

Currently available ventilation systems for computers have side-by-side fans mounted so that their axes of rotation extend perpendicular to the chassis outer back wall drawing common air from the inside of the computer through the fan blades and directly out of the chassis. See, for example, the ventilation systems described in U.S. Pat. Nos. 5,339,214; 4,751,872; 4,767,262; 5,193,050; 5,285,347; 5,490,723; 4,899,254; 5,505,533; and 5,247,427. Since the fans used in such known ventilation systems must be sized to fit within available back panel real estate limitations, the volume of warm air removed by known ventilation systems is necessarily limited. Increasing the diameter of the fans in known systems greatly increases the ventilation system's overall size, requiring an equally large increase in the back panel space needed for installation.

The assignee hereof filed a patent application (Ser. No. 08/770,890) on behalf of the Applicants of the instant patent application, on Dec. 20, 1996 entitled Compact Ventilation Unit for Electronic Apparatus. The invention disclosed in both this patent application and the earlier-filed pending patent application (Ser. No. 08/770,890) were invented by Applicants while employed by the assignee.

Known ventilation systems, as designed, do not adequately allow for increased air removal without a corresponding substantial increase in the chassis space required for installing the system. For example, to increase the volume of warm air removed by the side-by-side ventilation system in U.S. Pat. No. 4,767,262, more side-by-side fans had to be added with their axes of rotation also extending perpendicular to the chassis outer back wall. In another example, to increase the cooling within desktop personal computer chassis 200 of U.S. Pat. No. 5,572,403, inventor Mills added a second cooling fan downstream of the first fan so that both fans are coaxially aligned within a common plenum 430. In most computerized devices, chassis real estate is not available to accommodate more powerful ventilation systems having large external exhaust port space requirements. Without reasonable solutions at hand for adequately ventilating the interior space of a complex electronic instrument, an electronic designer can be severely limited in component and printed circuit board design alternatives.

The new compact ventilation unit, described herein, is designed for operation within a wide range of electronic apparatuses that require removal of unwanted thermal energy generated by electronic components during use. This innovative unit has the capacity to remove a greater amount of thermal energy to maintain desired component operating temperatures within a computerized device, without requiring a substantial increase in the size of its side containing airflow exhaust ports. Less exterior computer housing real estate is needed to install the present invention than for known cooling systems. Furthermore, this new unit can be installed and removed with relative ease and it can reach further into the interior of an electronic device to expel heat generated within, out an exterior (usually, located on the back) housing panel. The new unit incorporates a redundant powered air mover to lower the chance of component overheating and can accommodate suitable couplings for hot plugging into an electronic apparatus as necessary.

Unlike the ventilation systems currently available comprised of propeller fans having axes of rotation extending perpendicular to the chassis back wall, the new unit and new method were developed to utilize chassis wall space more efficiently while at the same time provide sufficient ventilation. As will be explained, a third and fourth fan, and so on, can be added to the new unit described herein, in the spirit of this design goal.

SUMMARY OF THE INVENTION

It is a primary object of this invention to provide a ventilation unit for operative arrangement within an electronic apparatus that has at least two powered air movers, each of which can draw air, or some other gas, in through an intake side of the air movers and out respective exhaust ports of an exterior side of the unit. It is also an object of this invention that such a ventilation unit have an exterior side comprising the exhaust ports located in stacked relationship so that the unit can fit into smaller-sized electronic apparatus chassis back panels. It is also an object of this invention to provide a method of venting thermal energy generated within an electronic apparatus by drawing air, or some other gas, in through the intake side of a first and second powered air mover and then out respective first and second exhaust ports of an exterior side of a ventilation unit, the exhaust ports being located in stacked relationship.

The advantages of providing both the compact new ventilation unit and the new method of venting thermal energy within an electronic apparatus, as described herein, are as follows: (a) Thermal energy, or heat, generated by electronic components and assemblies can be expelled from an electronic apparatus chassis using this new unit with its two powered air movers, without requiring a substantial increase in size of the chassis; (b) It is desirable to have at least two powered air movers available for use—for back-up in the event the other air mover fails; (c) Sufficiently maintaining the internal temperature of an electronic apparatus aids in reducing electronic component degradation, thus extending component life; (d) Unit design flexibility—additional powered air movers can be added to expel a greater amount of heat or expel heat at a faster rate without requiring a substantial increase in size of the unit's exterior side containing exhaust ports; (e) Electronic apparatus design flexibility—a ventilation unit designed to take up less chassis back panel real estate, allows design engineers greater design flexibility to accommodate additional chassis connectors, fasteners, ports, etc. into the design of an electronic apparatus; (f) Unit design simplicity—reducing the number and size of components required to build a ventilation can substantially reduce its overall fabrication cost; and (g) Versatility—the new unit can be sized appropriately to fit within a wide range of electronic apparatus chassis sizes, and the new unit can be built with components having the capacity to remove a requisite amount of heat at a faster rate so that it can be used in a wide variety of electronic apparatuses.

Briefly described, the invention includes a ventilation unit for operative arrangement within an electronic apparatus. This unit has: an exterior side having a first exhaust port separated from and in stacked relationship with (below or above depending upon unit orientation), a second exhaust port; and a first and second powered air mover, each having an intake side oriented at an angle greater than zero degrees from the exterior side. The first powered air mover intake side is in communication with the first exhaust port. Gas, such as air, removed from the electronic apparatus can be drawn in through an intake side of the second powered air mover, then directed through a duct cover before it flows between a covered side of the first powered air mover and a support member side of the unit. For greater efficiency, the angle of orientation is preferably between twenty and one-hundred degrees, and more-preferably about 90 degrees. Additional powered air movers can be accommodated, each with a respective exhaust port.

Also characterized herein, is a ventilation unit with an exterior side having first and second exhaust ports; the exterior side of the unit is adjacent a support member side to which a second powered air mover has been secured; and a first powered air mover is included in communication with the first exhaust port. Also, the first powered air mover can have a first covered side opposite an intake side. Gas drawn in through an intake side of the second powered air mover flows between the first covered side and the support member side before exiting the second exhaust port.

Additional design features that further distinguish the ventilation unit of the invention from known side-by-side fan cooling system designs include: the exterior side can be made so that its outer width is substantially equal to the outer width of the widest powered air mover and its height is equal to or less than the sum of the thicknesses of the powered air movers; the first powered air mover can be secured to the support member by mounting flaps; the duct cover can be tapered; and one powered air mover can be located closer to the exterior side than the other air mover.

The invention also includes a method of venting thermal energy generated within an electronic apparatus through an exterior side of a ventilation unit operating within the apparatus. This method comprises the steps of drawing air in through a first intake side of a first powered air mover and out a first exhaust port of the exterior side, separately from drawing air in through a second intake side of a second powered air mover and out a second exhaust port of the exterior side located in stacked relationship with (above or below, depending upon unit orientation) the first exhaust port. The first intake side can be located closer to the exterior side than the second intake side. The operation of the first and second powered air movers can occur concurrently or independently.

BRIEF DESCRIPTION OF THE DRAWINGS

The invention will be more particularly described by referencing the accompanying drawings of the preferred embodiments, in which like numerals designate like parts.

DETAILED DESCRIPTION OF THE PREFERRED EMBODIMENTS

Figure 1:
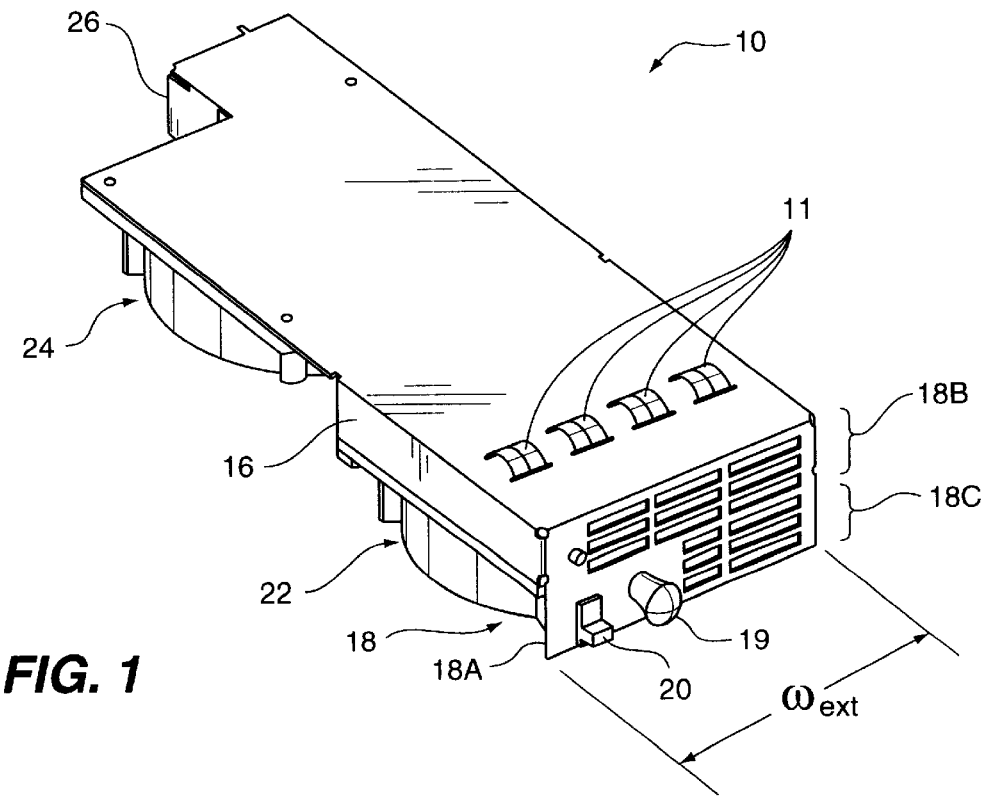
FIG. 1 is an isometric view of a preferred ventilation unit of the invention.
Figure 2:
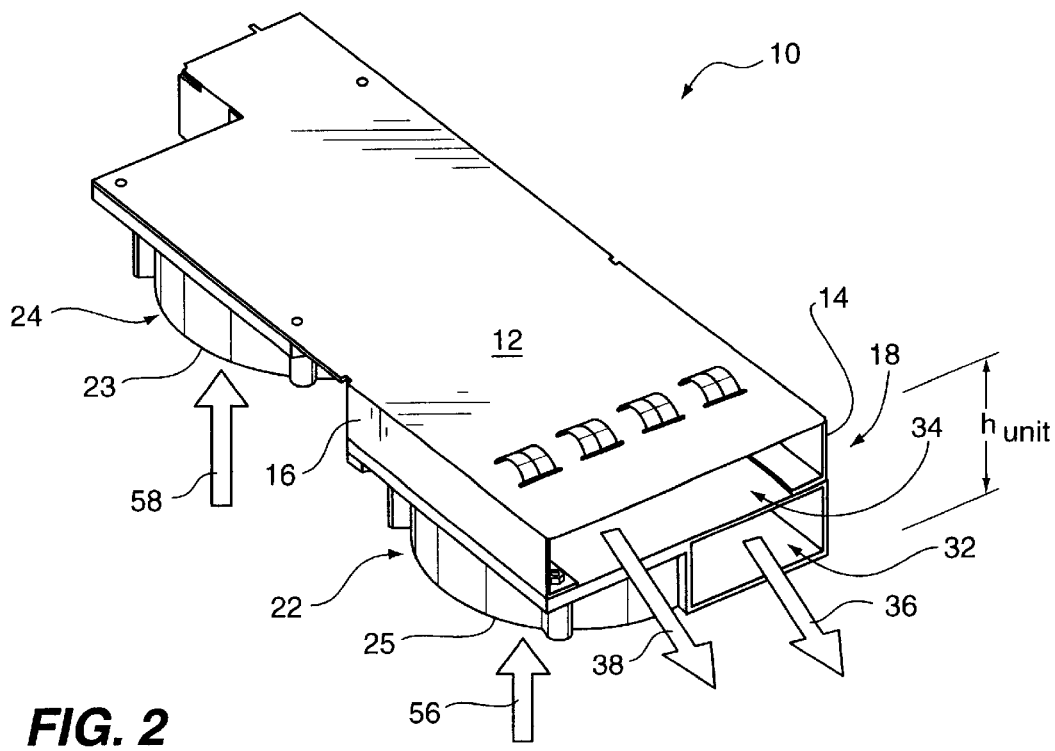
FIG. 2 is an isometric view, similar to that of FIG. 1 except the grated panel 18a has been removed so that the two exhaust ports in exterior side 18, as well as the direction of a gas (such as air) flowing into and out of the unit, can be seen.

The preferred compact ventilation unit 10 in FIG. 1, shows support member plate 12 connected to grated panel 18a of the exterior side (at 18) and mounting flap 16. Panel 18a of exterior side 18 has grating labeled 18b, 18c that allows gas, such as air, to exit the unit. Grating 18b covers exhaust port 34 and grating 18c covers exhaust port 32 (exhaust ports are shown in FIG. 2). It is well known that current flowing through conductive wire (as does in an electric motor) generates an electromagnetic field (EMF) around the wire. In turn, current can be induced in a conductive member placed within such an electromagnetic field. Using this known EMF theory, one can design a device to cancel unwanted electromagnetic fields. Panel 18a functions as shield to reduce electromagnetic radiation generated within unit 10. Knob 19 and a latch mechanism 20 have been located on panel 18a for releasably securing unit 10 within an electronic apparatus such as a personal computer (PC), workstation, mainframe, fax machine, copier, scanner, or other computerized and/or electronic device (these apparatuses are not shown, here, since their features are well known). Unit 10 is preferably designed to slide and snap into place within a chassis. Prior to removing the unit, one can disengage the latch shown at 20, or other suitable lock-and-release mechanism, to unlock the unit. A knob, such as that shown at 19, has been included to remove unit 10 from a chassis (not shown).

In FIG. 1, one of two mounting flaps can be seen at 16. These mounting flaps are used for mounting powered air mover (PAM) assembly 22 to support member 12. The additional PAM assembly shown at 24 can be mounted to the underside of support member plate 12. The fastening or securing means used to mount the PAM assemblies is not critical, any suitable fasteners such as bolts, screws, nails, hooks-and-loops (such as VELCRO®), and adhesives may be employed as long as the fastening means can withstand temperatures to which the unit 10 will be exposed. BeCu (a metal alloy chosen for its conductivity) clip-springs are shown at 28 and attached to support member 12 for grounding the unit. The back side 26 of unit 10 can be used to mount an electrical connector assembly that connects the unit to a source of power from either the electronic apparatus in which the unit 10 has been installed, or from some external source of power—the electrical connector assembly will be described in greater detail below. The width of exterior side 18 has been labeled $w_{ext}$—it will also be discussed in greater detail below.

FIG. 2 illustrates exhaust port 32 in stacked relationship to exhaust port 34 of exterior side 18. Although exhaust ports 32 and 34 are shown without any separation member or material, one could add (and, in the event design specifications dictate, it may be necessary to add) a shim, dampening material, insulation, another exhaust port, etc., between exhaust ports 32 and 34 without destroying the function of unit 10. Arrow 56 illustrates the direction of flow of a gas, such as air, into the intake side 25 of PAM assembly 22. The gas that entered PAM assembly 22 exits unit 10 out exhaust port 32 along arrow 36. Likewise, arrow 58 illustrates the direction of flow into intake side 23 of PAM assembly 24. The gas that entered PAM assembly 24 exits unit 10 out exhaust port 34 along arrow 38. As unit 10 is oriented in FIG. 2, the support member side 12 is found at the top of the unit. However, in operation within an electronic apparatus, the unit need only be oriented so that intake sides 25, 23 are capable of drawing out heat generated within the electronic apparatus. The flow of thermal energy, or heat, through a preferred unit will be described in greater detail in connection with other figures.

In FIG. 2, one can better appreciate how PAM assembly 22 can be secured to mounting flaps 14, 16 using suitable means. The height of unit 10, shown at $h_{unit}$, is shown as approximately equal to the sum of the thicknesses of PAM assembly 22 and PAM assembly 24 (see, particularly, FIG. 6 where respective thicknesses of PAM assemblies 22 and 24 are shown at $t_{pam1}$ and $t_{pam2}$). Where space is severely limited within a chassis, unit 10 as designed can accommodate a height $h_{unit}$ less than the sum of the thicknesses of PAM assemblies 22 and 24. In the event a separation member or material is added between exhaust ports 32 and 34 (as discussed above), $h_{unit}$ may necessarily be greater than such sum. In known cooling systems, unlike the preferred invention, propeller fans are positioned side-by-side so that warm air is drawn in through and out the fan blades along the same direction. Also unlike the preferred unit of the invention, the exterior wall area of these known cooling systems through which air is expelled must necessarily be larger than the sum of the total fan blade area taken up by each individual fan to provide adequate clearance for the rotating fan blades.

Figure 3:
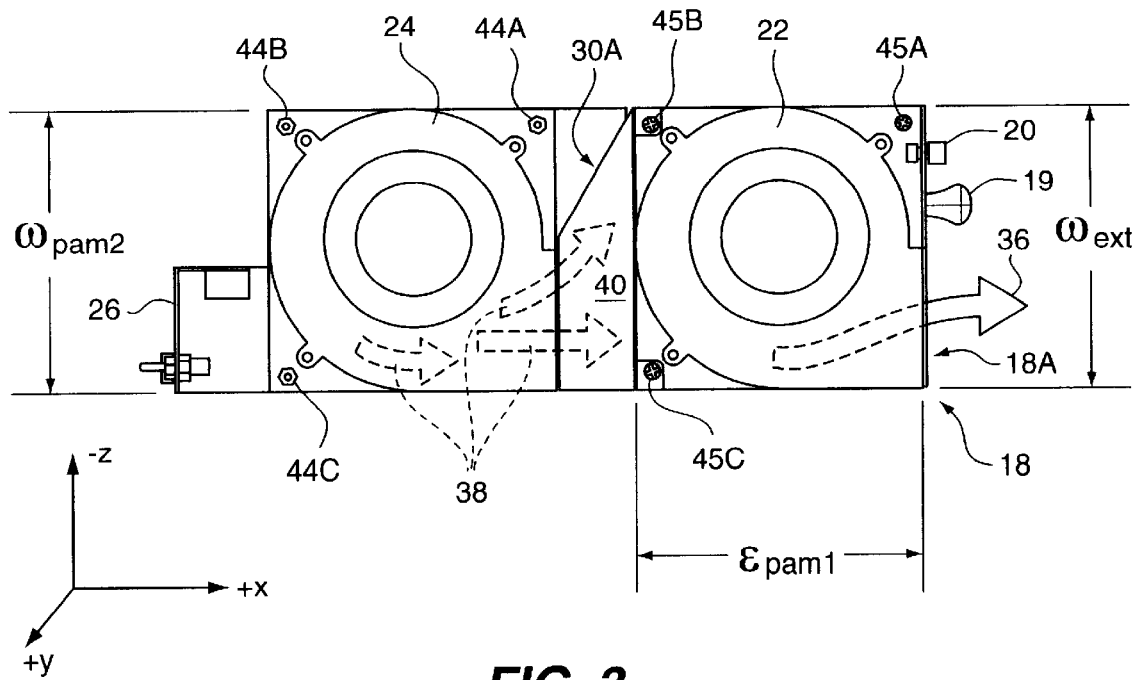
FIG. 3 is a bottom plan view of a preferred ventilation unit showing the direction of air flow through powered air mover assemblies 22, 24 and out of the unit.

The bottom plan view of FIG. 3 provides further detail of the fastening means at 45a, 45b, 45c used in this embodiment of the invention to secure PAM assembly 22 to mounting flaps (14, 16 in FIG. 2). Here, by way of example, three screws were used. Furthermore, three 6-32 hex locking nuts are shown at 44a, 44b, 44c as the fastening means used to secure PAM assembly 24 to the unit. Arrows 38 (shown in phantom) illustrate how air, or some other gas, exiting PAM assembly 24 spreads out as it flows under duct cover 40. Side surface 30a of duct cover 40 has been angled to streamline the flow of gas out of PAM assembly 24. Arrow 36, again, illustrates the direction of air, or some other gas, exiting both PAM assembly 22 and exterior side 18. Knob 19 and latch 20 can be seen extending from panel 18a; and back side 26 is labeled for reference. The width $w_{ext}$ of exterior side 18 is generally less than the sum of the outer width of PAM assembly 22 plus the outer width of PAM assembly 24. Preferably, width $w_{ext}$ of exterior side 18 is substantially equal to the outer width of the widest PAM assembly, and as shown $w_{ext}$ is equal to the outer width of PAM assembly 24 (labeled $w_{pam2}$).

In FIG. 3, unlike known cooling systems with more than one fan, PAM assembly 22 has been positioned closer to exterior side 18 than PAM assembly 24. Here, the length of PAM assembly 22 has been labeled $\epsilon_{pam1}$. Preferably, PAM assembly 24 is located a distance from exterior side 18 that is greater than the length of PAM assembly 22 (here, labeled $\epsilon_{pam1}$) to accommodate a duct cover (such as the one shown at 40) and to allow air (or other gas) to enter intake sides 25, 23 (along arrows 56, 58) generally unobstructed.

Figure 4:
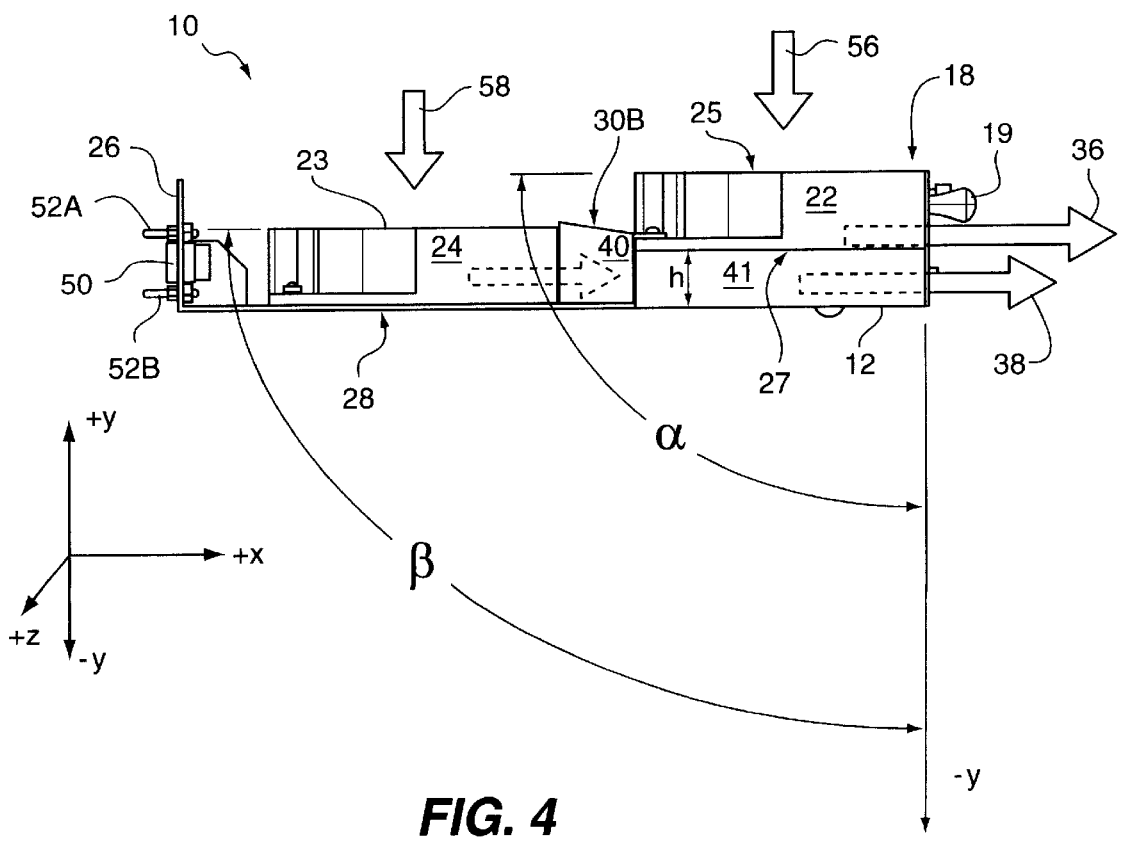
FIG. 4 is a side elevational view of the FIG. 3 unit again illustrating the direction of air flow through the unit. The FIG. 4 unit is oriented so that support member 12 is facing downward in the figure.

The novel heat removal approach of a preferred unit 10 can be better appreciated in the side elevational of FIG. 4. Excess heat generated within an electronic apparatus is removed by being drawn into intake sides 25 and 23. Opposite the intake side 25 of PAM 22 is a covered side 27. Likewise, opposite the intake side 23 of PAM 24 is a covered side 28. Warmed air follows arrow 58 into intake side 23 of PAM 24, then follows the arrows labeled 38 (shown in phantom) through duct cover 40, and then between covered side 27 and support member 12 (the plenum created therebetween has been labeled 41), and finally out exterior side 18. Likewise, warmed air following arrow 56 flows in through intake side 25 of PAM 22, then follows arrow 36 out exterior side 18. The top surface 30b of duct cover 40 has been tapered to streamline the flow of gas out PAM 24 and into plenum 41. To accommodate the taper of duct cover 40, unit 10 has been designed so that plenum height, $h_p$, is less than the thickness of PAM 24 ($t_{pam2}$ in FIG. 6).

In FIG. 4 the angle between intake side 25 and exterior side 18 has been labeled α ("alpha") and the angle between intake side 23 and exterior side 18 has been labeled β ("beta"). Unlike known computer cooling systems, these two labeled angles of orientation of intake sides 25 and 23 are preferably greater than zero and less than about 100 degrees. As shown, since angles α and β are roughly 90 degrees, then the general direction of air flow into intake sides 25, 23 (along arrows 56, 58) is also roughly 90 degrees from the general direction of air flow out of exterior side 18 (along arrows 36, 38). An electrical connector (or plug) assembly 50 and two threaded guide pins 52a, 52b are shown attached to back side 26. The guide pins aid in positioning unit 10 into its designated place within an electronic apparatus. To better control the flow of warm air when one or more of the PAM assemblies stops or fails, hot plugging or blind mate insertion may be accomplished via connector assembly 50. Connector 50 may be located on unit 10 where space is conveniently available.

It is critical that the preferred unit draw heat or warmed air in through intake sides (such as those at 25, 23) and out exhaust ports of an exterior side. As one can imagine, for example, mounting a powered air mover with its intake side oriented at an angle α or β equal to 45 degrees from the −y direction as shown, would increase the height $h_{unit}$ without requiring a corresponding increase in width $w_{ext}$. By way of example as shown, radial impeller fans (having blades 62, 64 in FIG. 6) with intake sides oriented along the x-axis direction (so that angle (α or β is approximately 90 degrees) will be most efficient at removing warm air from the inside of an electronic apparatus. As the orientation of a radial impeller fan intake side moves from the x-axis direction (as shown in FIG. 4) to an angle α, β equal to zero degrees (note that, at α or β equal to zero degrees, the fan axes of rotation are oriented along the x-axis direction so that arrow pairs 56, 36 and 58, 38 are oriented along the same direction), the fans become less efficient at removing thermal energy and $h_{unit}$ increases so that the unit will take up more back panel chassis space.

Figure 5:
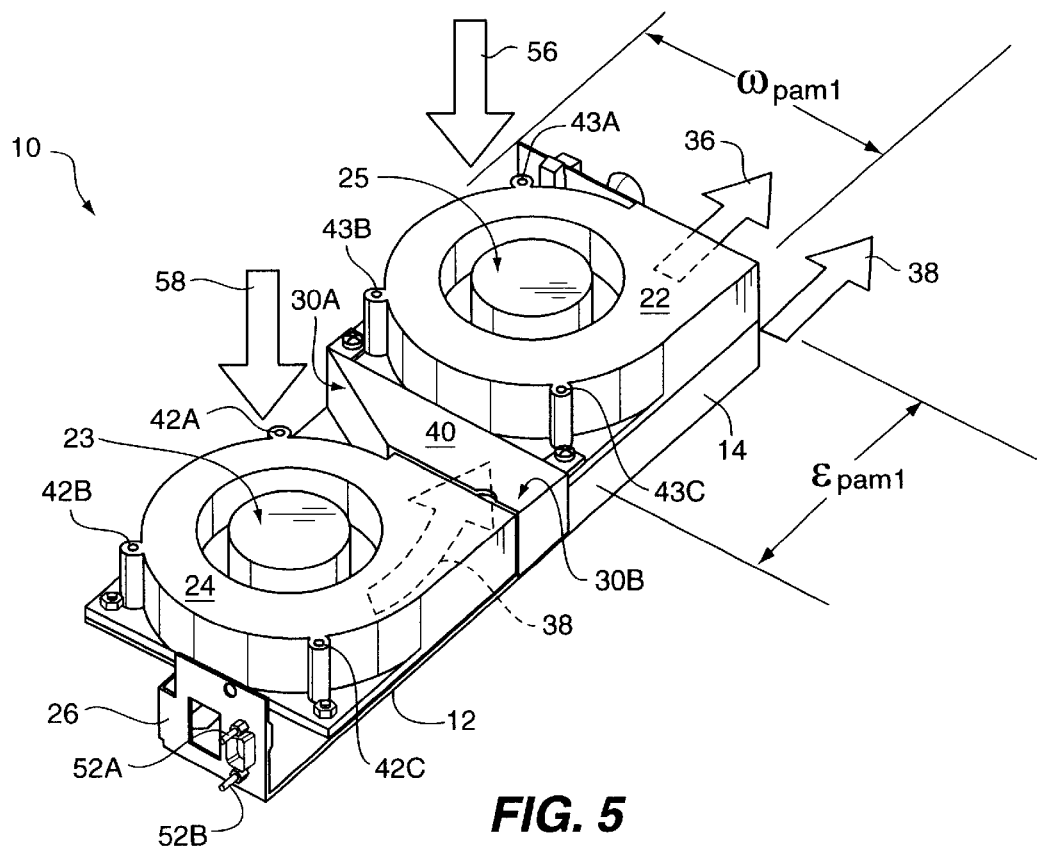
FIG. 5 is an isometric view of the preferred unit oriented as in FIG. 4 (i.e., with support member 12 facing downward) providing more detail of the powered air movers.

If one were to flip the unit of FIGS. 1 and 2 over, the view in FIG. 5 would appear. Here, the PAM assembly labeled 22 has three labeled points at which its outer shell has been secured, namely 43a, 43b, 43c. Again, one can see how warmed air, or other gas, enters intake side 25 in the direction of arrow 56 and exits in the direction of arrow 36. Likewise, the PAM assembly labeled 24 has three labeled points at which its outer shell has been secured, namely 42a, 42b, 42c. And, one can see how warmed air, or other gas, enters intake side 23 in the direction of arrow 58 and exits in the direction of arrows 38 (one of which is in phantom). The phantom arrow 38 illustrates the direction of more-streamlined flow beneath the tapered top surface 30b and angled side surface 30a of duct cover 40. Again for reference, the width of PAM 22 has been labeled $w_{pam1}$ and its length has been labeled $\epsilon_{pam1}$. The back side flap 26 has been bent and formed as an integral part of support member 12 (which is found at the bottom of unit 10 in FIG. 5). Also shown are guide pins 52a, 52b. It is unnecessary to encase PAM assemblies further with a separate cover.

It can be appreciated that, unlike known computer cooling systems having propeller fans located side-by-side that pull air through their blades (oriented with axes of rotation perpendicular to the back wall of the computer's housing) and then expel this air straight out, the novel heat flow approach of the instant invention and compact design of the exterior side 18 of unit 10 allows it to be installed in an electronic apparatus without taking up a great deal of valuable chassis back wall real estate.

Figure 6:
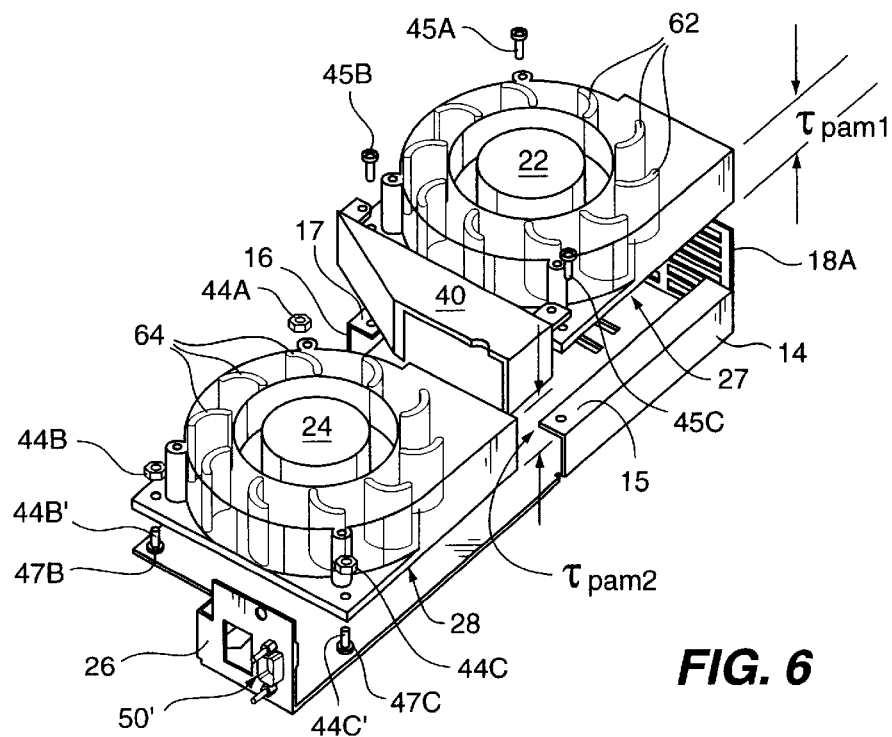
FIG. 6 shows the powered air movers 22, 24, duct cover 40, and support member 12 in an exploded isometric view to better illustrate how the powered air mover assemblies can be secured in a preferred ventilation unit.

Although not limited as such, the two PAM assemblies 22, 24 in FIG. 6 could be radial impeller fans, each contained in a shell. Impeller blades 62, 64 rotate around an axis oriented generally perpendicular to support member 12 (i.e. generally parallel to exterior panel 18a). By way of example only, suitable radial impeller fan and motor assemblies include the Brushless DC SCIROCCO ACE™ fan assembly distributed by Sanyo Denki Company Ltd. (that uses a polycarbonate impeller), or the BISCUIT® DC Brushless DC Blower distributed by Comair Rotron (the impeller of which is made of black polypropylene) with a motor that runs off a DC (direct current) source. Powered air movers, or PAM(s) as that term is used herein, includes a wide variety of mechanical devices capable of moving warmed gas, such as air through a unit of the invention: radial, centrifugal, and screw impeller fans; reciprocating blade fans; and other suitable blower mechanisms. Fan blades can be made of metal alloys, hi-impact lightweight plastics, and other suitable durable materials. Many types of suitable, sufficiently reliable fan and blower motors are available that can provide requisite power (whether driven off an AC or DC source).

Powered air movers 22, 24 can be controlled to operate concurrently and/or independently, depending upon cooling requirements of the electronic device in which unit 10 has been installed. For example, a temperature sensor (not shown) connected to unit 10 to sense internal electronic device chassis temperature could send appropriate electronic signals to either one or both air movers to turn on (and/or off) as additional cooling is needed (or not). Furthermore, a system failure sensing mechanism and failure indicator (such as the LED shown at 69 in FIG. 7) may be included to signal whether one of the PAM assemblies has failed, so that one of the other PAM assemblies can be signaled to turn on, as necessary. Suitable simple temperature and system failure sensing mechanisms and LED failure indicators are well known and available.

Figure 7:
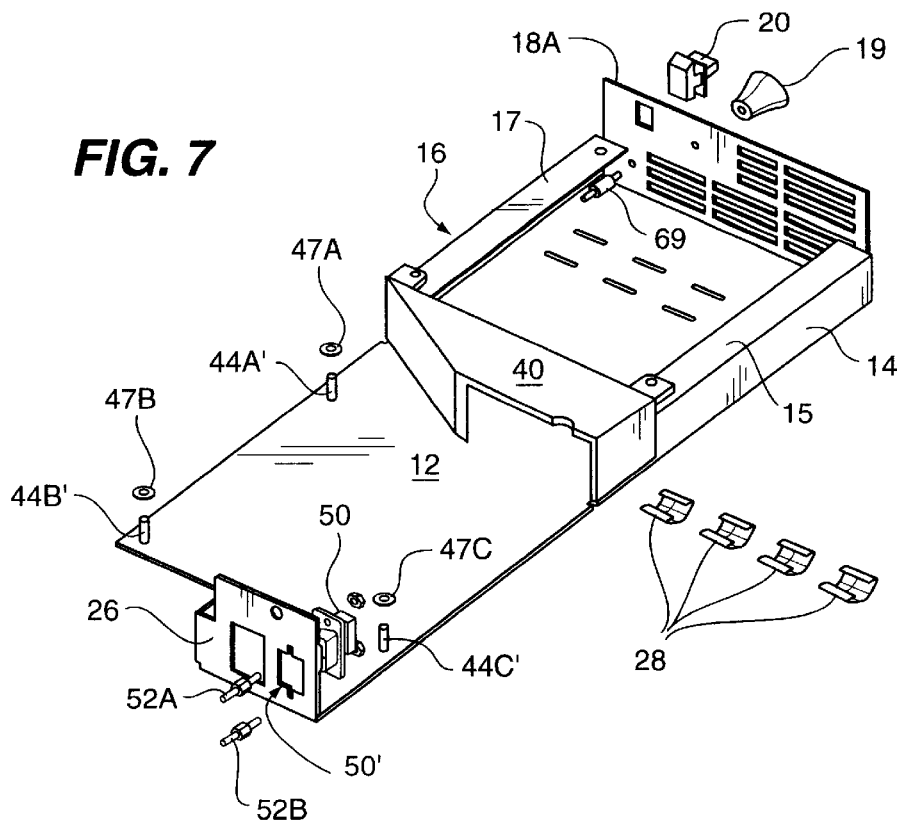
FIG. 7 is an isometric view of a preferred unit similar to that in FIG. 6, except that certain other components are illustrated in exploded fashion and the powered air mover assemblies have been removed.

As shown in the FIG. 6 exploded view, support member 12 contains PEM stand-offs at 44b' and 44c' (the third, 44a' can be seen in FIG. 7). Each PEM stand-off has a nylon (or other suitable insulator) spacer 47b, 47c (and 47a in FIG. 7) and a 6-32 hex locking nut to hold secured PAM assembly 24 in place slightly above support member 12. The space provided between the covered side 28 of PAM assembly 24 and support member 12 allows ambient air to flow to cool the motor of PAM assembly 24. Three 6-23×0.5 pan head screws labeled 45a, 45b, 45c are used to secure PAM assembly 22 to lip portions 15 and 17 of mounting flaps 14 and 16, respectively. Screws 45b, 45c also function to secure duct cover 40 in place. The opening at 50' in back side flap 26 has been created to accommodate connector assembly 50 as positioned in FIG. 4.

FIG. 7 shows that back side flap 26, mounting flaps 14, 16 and their respective lip portions 15, 17, and exterior side grated panel 18a can be formed by bending, thermal forming, injection molding, or other suitable well known methods as integral parts of support member 12. Although support member 12 is shown rectangular in shape, it need not be: its walls could be curved or otherwise modified to aid in producing less turbulent flow of warm air throughout unit 10. For example, member 12 could be designed as a tear-drop in shape. The design of a support member side is driven by available chassis space, as well as ease of replacement and mounting specifications within a chassis. Suitable materials for support member 12 and duct cover 40 include lightweight metal alloys, durable plastics with sufficient strength to support and withstand vibration of the powered air movers in operation, and other similar materials able to withstand internal temperatures of electronic apparatuses into which the unit is installed.

FIG. 7 also illustrates PEM stand-offs 44a', 44b', 44c' and each respective nylon (or other suitable insulator) spacer 47a, 47b, 47c, an LED 69 to indicate PAM failure, conductive clip-springs at 28, the knob 19 and latch 20 for panel 18a, electrical connector 50 and its opening 50' on back side panel 26, plus guide pins 52a, 52b.

Additional PAM assemblies may be added to a preferred unit 10. Preferably, the back side labeled 26 would be pushed out (see FIG. 9) to locate an additional air mover. To accommodate another PAM assembly, PAM assembly 24 would need its own set of mounting flaps similar to flaps 14, 16 (used to mount PAM 22). An additional corresponding exhaust port would preferably be added to exterior side 18 so that the exhaust ports are in stacked relationship to one another.

Figure 8:
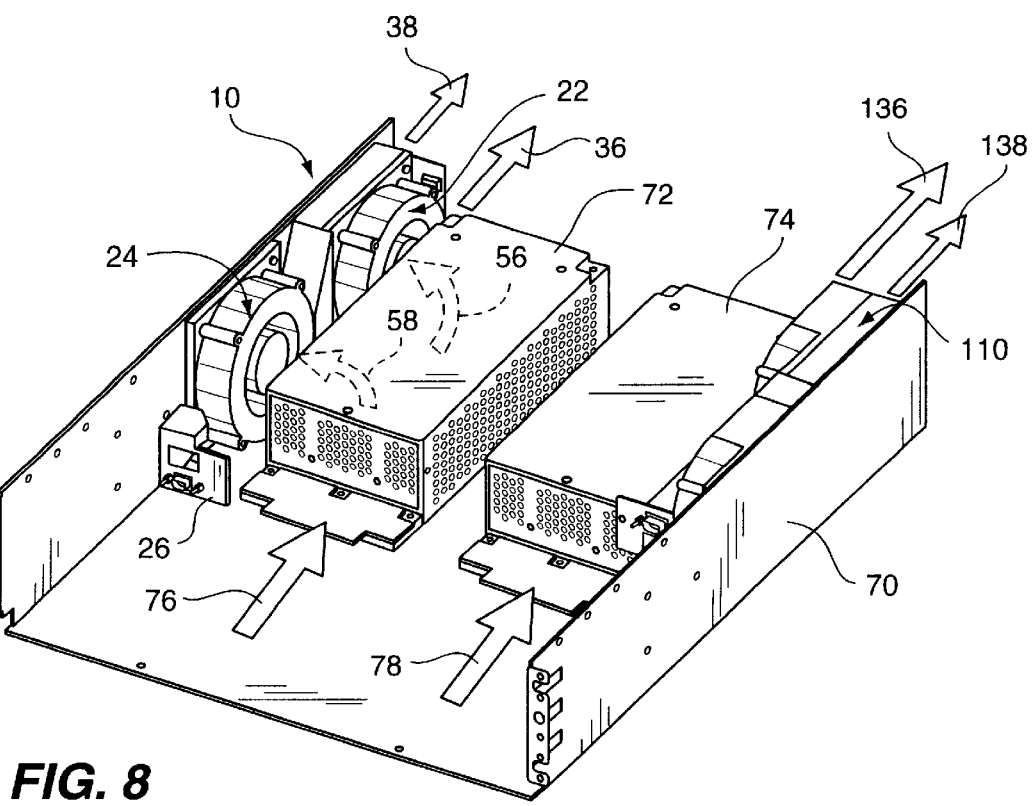
FIG. 8 is an isometric view of one way to orient and mount a ventilation unit of the invention within an electronic apparatus chassis; the chassis shown (at 70) could be that from an apparatus such as a personal computer (PC), workstation, mainframe, fax machine, copier, scanner, or other computerized and/or electronic device.

FIG. 8 illustrates the design flexibility of the invention as mounted in an electronic apparatus chassis 70. The orientation of a unit of the invention in a chassis depends upon: available space; which area or components of the apparatus needs to be cooled; the availability of space for mounting support member 12; and so on. As mentioned earlier, the chassis shown could be that from an apparatus such as a personal computer (PC), workstation, mainframe, fax machine, copier, scanner, or other computerized and/or electronic device. Here, two units 10, 110 have been mounted along the side walls of chassis 70 to draw air along arrows 76, 78 into subassembly housings 72, 74. As can be seen with unit 10, air flows in through PAM assemblies 22, 24 along arrows 56, 58, and out the unit's exterior side along arrows 36, 38. Likewise, heat flows into unit 110 and out the unit's exterior side along arrows 136, 138. Although not shown, a preferred unit 10 could also be mounted above a redundant array of independent disks (RAID) subsystem. A RAID subsystem typically includes a plurality of disk drives and a controller that provide redundant (or back-up) operation in the event of failure of any one of the disk components. One can increase the overall reliability of a RAID subsystem with adequate, reliable ventilation such as that provided by preferred unit 10. Several units, similar to the unit shown at 10, may be aligned side by side, as necessary, to provide adequate ventilation to a RAID.

Figure 9:
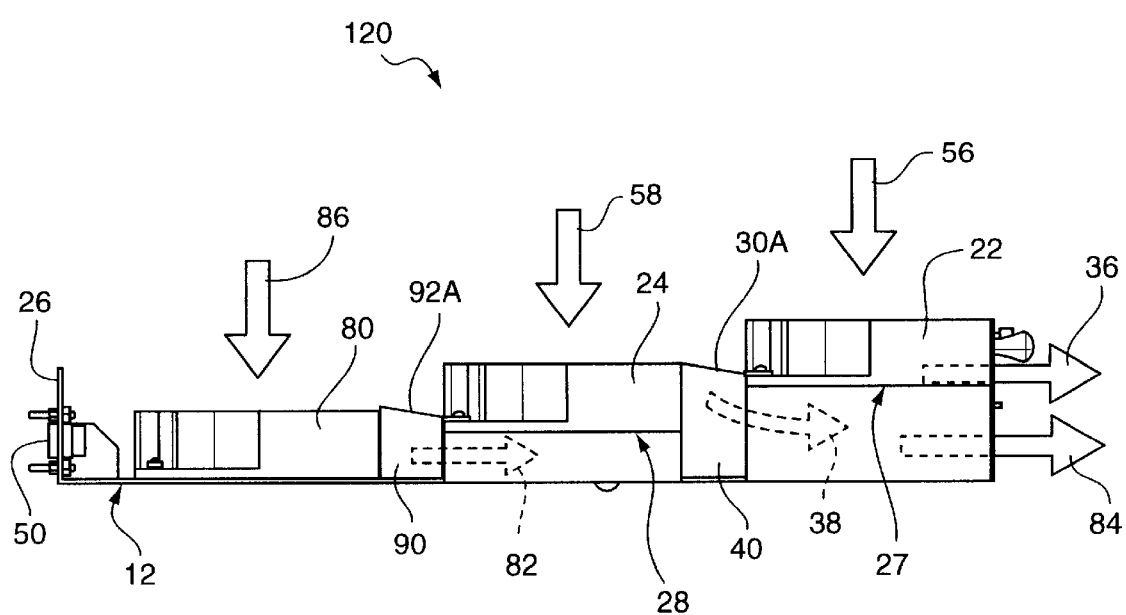
FIG. 9 is a side elevational view of an alternative unit, oriented in a manner similar to the preferred unit in FIG. 4, illustrating the direction of air (or some other gas) flow through three powered air mover assemblies 22, 24, 80.

An additional PAM assembly 80 has been added in the design of the alternative ventilation unit 120 in FIG. 9. Back side 26 with connector 50 has been pushed out to accommodate the additional PAM 80. Air (or other gas) flows along arrow 56 into PAM 22 and out along arrow 36. Air (or other gas) flows along arrow 58 into PAM 24 and out through duct cover 40 (that has a tapered top surface 30a) along phantom arrow 38 between covered side 27 and support member 12, and out unit 10 along arrow 84. Likewise, air flows along arrow 86 into PAM 80 and out through duct cover 90 (that has a tapered top surface 92a) along phantom arrow 82 between covered side 28 and support member 12, and out unit 10 along arrow 84. One could add (and, in the event design specifications dictate, it may be necessary to add) a shim, dampening material, insulation, another exhaust port, etc., between existing exhaust ports 32, 34 (labeled in FIG. 2) and any additional exhaust port without destroying the function of unit 120. Similarly, a fourth powered air mover could be added, and so on.

By way of example only, representative dimensions of one unit produced with approximate outer rectangular dimensions of 12.3 inches in length, by 4.7 inches by 2.3 inches are as follows: the widths $w_{pam1}$ and $w_{pam2}$ of two radial impeller fans oriented with their intake sides oriented along the x-axis direction (see FIG. 4) were each approximately 4.7 inches; and the thicknesses of two Brushless DC SCIROCCO ACE™ radial impeller fan assemblies were each approximately 1.26 inches. The DC SCIROCCO ACE™ radial impeller fan assembly just happens to have a length equal to its width. One could use different sized (length, width, and thickness) powered air movers for each PAM assembly 22, 24, 80. And, it will be appreciated that if additional powered air movers are added and/or the orientation of powered air movers is modified, the outer dimensions of the ventilation unit of the invention will increase.

While certain representative embodiments and details have been shown for the purpose of illustrating the invention, those skilled in the art will readily appreciate that various modifications may be made to the invention without departing from the novel teachings or scope of this invention. Accordingly, all such modifications are intended to be included within the scope of this invention as defined in the following claims. In the claims, any means-plus-function clauses used are intended to cover the structures described herein as performing the recited function and not only structural equivalents but also equivalent structures.

What is claimed is:

1. A ventilation unit for operative arrangement within an electronic apparatus, the unit comprising:
   an exterior side having a first exhaust port separated from and in stacked relationship with, a second exhaust port;
   a first and second powered air mover, each having an intake side oriented at an angle greater than zero degrees from said exterior side;
   said first powered air mover intake side in communication with said first exhaust port and said second powered air mover intake side in communication with said second exhaust port; and
   a tapered duct for directing the flow of gas out of said second powered air mover, wherein a height of said exterior side is less than a sum of an outer thickness of said first powered air mover plus an outer thickness of said second powered air mover.

2. The unit of claim 1 wherein said first powered air mover is located closer to said exterior side than said second powered air mover and said angle is less than one-hundred degrees.

3. The unit of claim 2 wherein said second powered air mover is located a distance from said exterior side that is substantially equal to or greater than a length of said first powered air mover.

4. The unit of claim 1 further comprising a support member side adjacent said exterior side, and wherein said second powered air mover further comprises a second covered side opposite said second powered air mover intake side, said second covered side secured to said support member side.

5. The unit of claim 4 wherein:
   said first powered air mover further comprises a first covered side opposite said first powered air mover intake side; and
   said second powered air mover comprises a radial impeller fan to draw air in through said second powered air mover intake side, out through said tapered duct, then between said first covered side and said support member side, and out said second exhaust port.

6. The unit of claim 5 wherein said support member side comprises mounting flaps to which said first powered air mover is secured.

7. The unit of claim 4 wherein said second powered air mover comprises a propeller fan having its axis of rotation substantially along the perpendicular to said support member side, to draw air in through said second powered air mover intake side and out said second exhaust port.

8. The unit of claim 1 wherein:
   said first powered air mover further comprises a first covered side opposite said first powered air mover intake side, said first covered side to baffle the gas flowing out said tapered duct.

9. The unit of claim 1 wherein an outer width of said exterior side is less than the sum of an outer width of said first powered air mover plus an outer width of said second powered air mover; and said angle is approximately 90 degrees.

10. The unit of claim 9 wherein said outer width of said first powered air mover is substantially equal to said outer width of said second powered air mover.

11. The unit of claim 1 wherein an outer width of said exterior side is substantially equal to the larger of either an outer width of said first powered air mover or an outer width of said second powered air mover.

12. The unit of claim 11 wherein said outer width of said first powered air mover is greater than an outer width of said second powered air mover.

13. The unit of claim 1 further comprising a support member side adjacent said exterior side and a back side to which an electrical connector is attached, said support member side comprising mounting flaps to which said first powered air mover is secured.

14. The unit of claim 13 wherein said exterior side further comprises a grated panel to which a latch, for releasably securing the unit within the electronic apparatus, is attached.

15. The unit of claim 1:

wherein said exterior side further comprises a third exhaust port separated from and in stacked relationship with, said second exhaust port; and further comprising a third powered air mover, said second powered air mover located closer to said exterior side than said third powered air mover.

16. The unit of claim 15 wherein an outer width of said exterior side is substantially equal to the largest outer width of either of said first, second, or third powered air mover.

17. A ventilation unit for operative arrangement within an electronic apparatus, the unit comprising:

an exterior side having first and second exhaust ports;

said exterior side adjacent a support member side to which a second powered air mover has been secured; and a first powered air mover in communication with said first exhaust port, wherein said first powered air mover has a first covered side opposite an intake side; and gas is drawn in through an intake side of said second powered air mover, out through a tapered duct, and then between said first covered side and said support member side, wherein a height of said exterior side is less than a sum of an outer thickness of said first powered air mover plus an outer thickness of said second powered air mover.

18. The unit of claim 17 wherein said second powered air mover is located a distance from said exterior side that is greater than a length of said first powered air mover, and said support member side comprises mounting flaps to which said first powered air mover is secured.

19. The unit of claim 17 wherein:

said first and second powered air movers each comprise a radial impeller fan to draw air in through a respective intake side.

20. The unit of claim 17 wherein the apparatus is a computerized device and said first and second powered air movers operate concurrently to expel air through said exhaust ports.

21. The unit of claim 17 further comprising a powered air mover failure indicator and wherein said first and second powered air movers operate independently and concurrently to expel air through said exhaust ports as needed.

22. A ventilation unit for operative arrangement within an electronic apparatus, the unit comprising:

an exterior side having first, second, and third exhaust ports;

said exterior side adjacent a support member side to which a third powered air mover has been secured;

a first powered air mover in communication with said first exhaust port; and a second powered air mover in communication with said second exhaust port, wherein said first, second, and third exhaust ports are located in stacked relationship; said first powered air mover has a first covered side opposite an intake side; and gas is drawn in through an intake side of said second towered air mover, out through a tapered duct, and then flows along said first covered side and out said second exhaust port, wherein a height of said exterior side is less than a sum of an outer thickness of said first powered air mover plus an outer thickness of said second powered air mover plus an outer thickness of said third powered air mover.

23. A method of using the ventilation unit of claim 1 to vent thermal energy generated within the electronic apparatus through the exterior side of the ventilation unit.

* * * * *